US009125326B1

(12) United States Patent
Eichelberg

(10) Patent No.: US 9,125,326 B1
(45) Date of Patent: *Sep. 1, 2015

(54) INTEGRATED VENTILATION SYSTEM FOR ELECTRONIC EQUIPMENT

(71) Applicant: Amazon Technologies, Inc., Reno, NV (US)

(72) Inventor: John W. Eichelberg, Spokane, WA (US)

(73) Assignee: Amazon Technologies, Inc., Seattle, WA (US)

( * ) Notice: Subject to any disclaimer, the term of this patent is extended or adjusted under 35 U.S.C. 154(b) by 94 days.

This patent is subject to a terminal disclaimer.

(21) Appl. No.: 14/065,026

(22) Filed: Oct. 28, 2013

Related U.S. Application Data

(63) Continuation of application No. 12/979,010, filed on Dec. 27, 2010, now Pat. No. 8,582,292.

(51) Int. Cl.
*H05K 7/20* (2006.01)
*G06F 1/20* (2006.01)

(52) U.S. Cl.
CPC ........ *H05K 7/20718* (2013.01); *H05K 7/20554* (2013.01)

(58) Field of Classification Search
CPC .......... H05K 7/20572; H05K 7/20554; H05K 7/20736; H05K 7/20718
USPC ......................... 361/679.46–679.54, 688–723
See application file for complete search history.

(56) References Cited

U.S. PATENT DOCUMENTS

| | | | |
|---|---|---|---|
| 6,305,180 B1 | 10/2001 | Miller et al. | |
| 7,182,208 B2 | 2/2007 | Tachibana | |
| 7,319,594 B2 | 1/2008 | Nicolai et al. | |
| 7,510,421 B2 | 3/2009 | Fransen et al. | |
| 7,839,635 B2 | 11/2010 | Donowho et al. | |
| 7,898,804 B2 | 3/2011 | Olesiewicz et al. | |
| 7,907,402 B2 | 3/2011 | Caveney | |
| 8,139,358 B2 | 3/2012 | Tambe | |
| 8,582,292 B1 * | 11/2013 | Eichelberg | 361/679.49 |
| 2008/0180908 A1 | 7/2008 | Wexler | |
| 2008/0198549 A1 | 8/2008 | Rasmussen et al. | |
| 2009/0266607 A1 | 10/2009 | Hoffer et al. | |
| 2011/0267775 A1 | 11/2011 | VanDerVeen et al. | |

\* cited by examiner

*Primary Examiner* — Zachary M Pape
(74) *Attorney, Agent, or Firm* — Thomas | Horstemeyer, LLP

(57) ABSTRACT

One embodiment of a method of providing ventilation to electronic equipment comprises receiving exhaust air flow from first electronic equipment positioned next to a ventilation structure; directing the exhaust air flow out of exhaust fan assembly of the ventilation structure; receiving cold air from an intake fan assembly of the ventilation structure; and directing the cold air to an intake vent of second electronic equipment positioned next to the ventilation structure.

20 Claims, 10 Drawing Sheets

INTEGRATED VENTILATION SYSTEM FOR ELECTRONIC EQUIPMENT

CROSS REFERENCE TO RELATED APPLICATIONS

This application is a continuation of, and claims priority to, co-pending U.S. patent application entitled "Integrated Ventilation System for Electronic Equipment," filed on Dec. 27, 2010, and assigned application Ser. No. 12/979,010, which is incorporated herein by reference in its entirety.

BACKGROUND

Data centers and network rooms have been experiencing problems with heat for several years. In network rooms, computer hardware is installed in computer racks and cabinets. Generally, computer racks are lined up in alternating rows with cold-air intakes all facing one aisle (a cold aisle) and hot-air exhausts all facing another aisle (a hot aisle). One potential problem is hardware that features side-to-side ventilation having a right-to-left airflow pattern does not match up with the layout of the cold and hot aisles in the network room that is designed for a front-to-back airflow pattern.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

In front-to-back cooling systems, ambient air is drawn in the computer hardware from the front and heated exhaust air is discharged to the rear. However, some vendors have adopted side-to-side cooling airflow in their computer and electronic products. For example, Cisco has been using side-to-side cooling with the introduction of the 5K series switch and side-to-side cooling is now prominent in 4K, 5K, 6K, and 7K series routers and switches.

Figure 1:
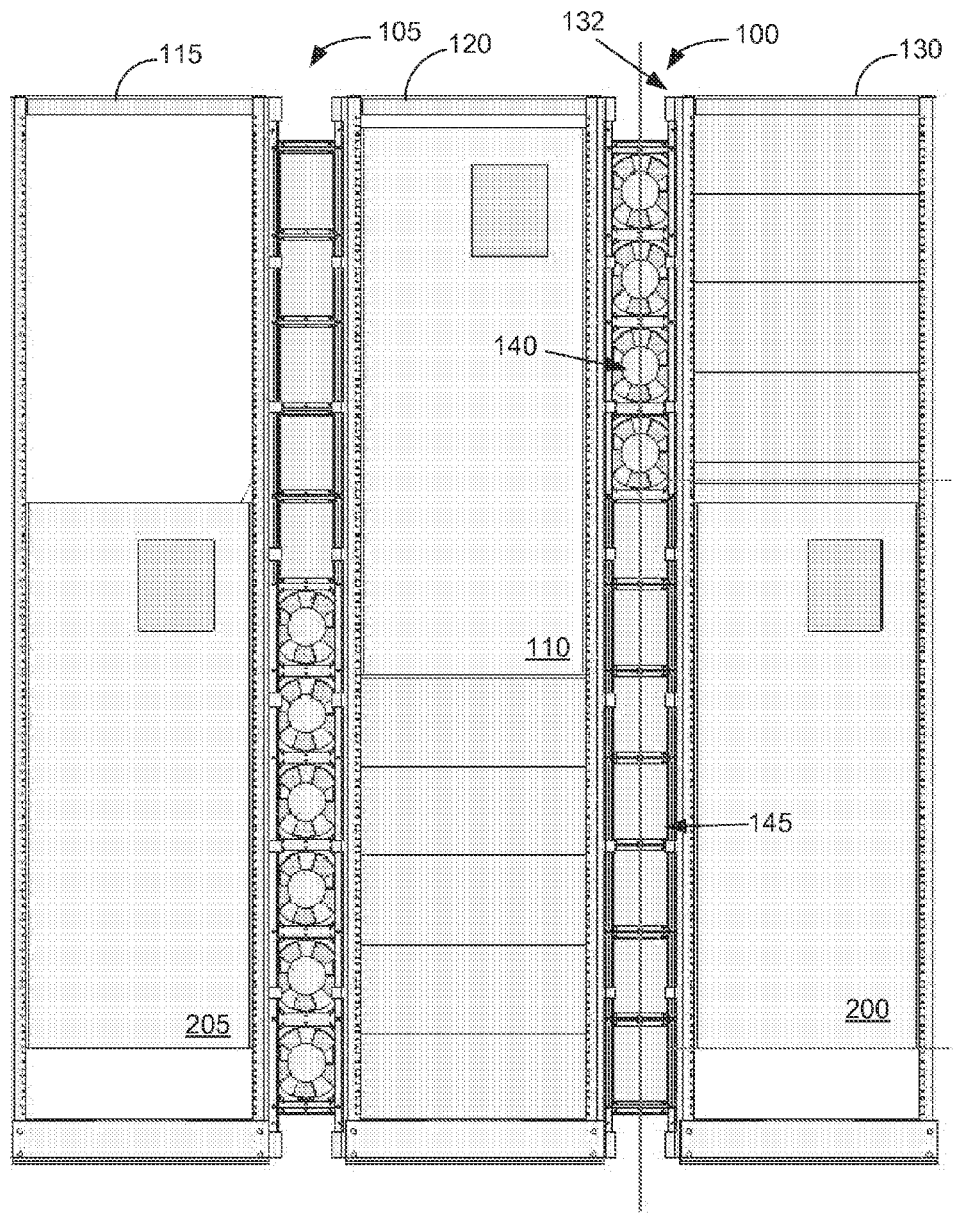
FIG. 1 is a diagram depicting a front view of one embodiment of an integrated ventilation system in accordance with the present disclosure.

Accordingly, FIG. 1 is a diagram depicting a front view of one embodiment of an integrated ventilation system 100, 105 in accordance with the present disclosure that adapts airflow patterns in a network room's cold and hot aisles with computer hardware or electronic equipment 110 having side-to-side airflow ventilation.

Figure 2:
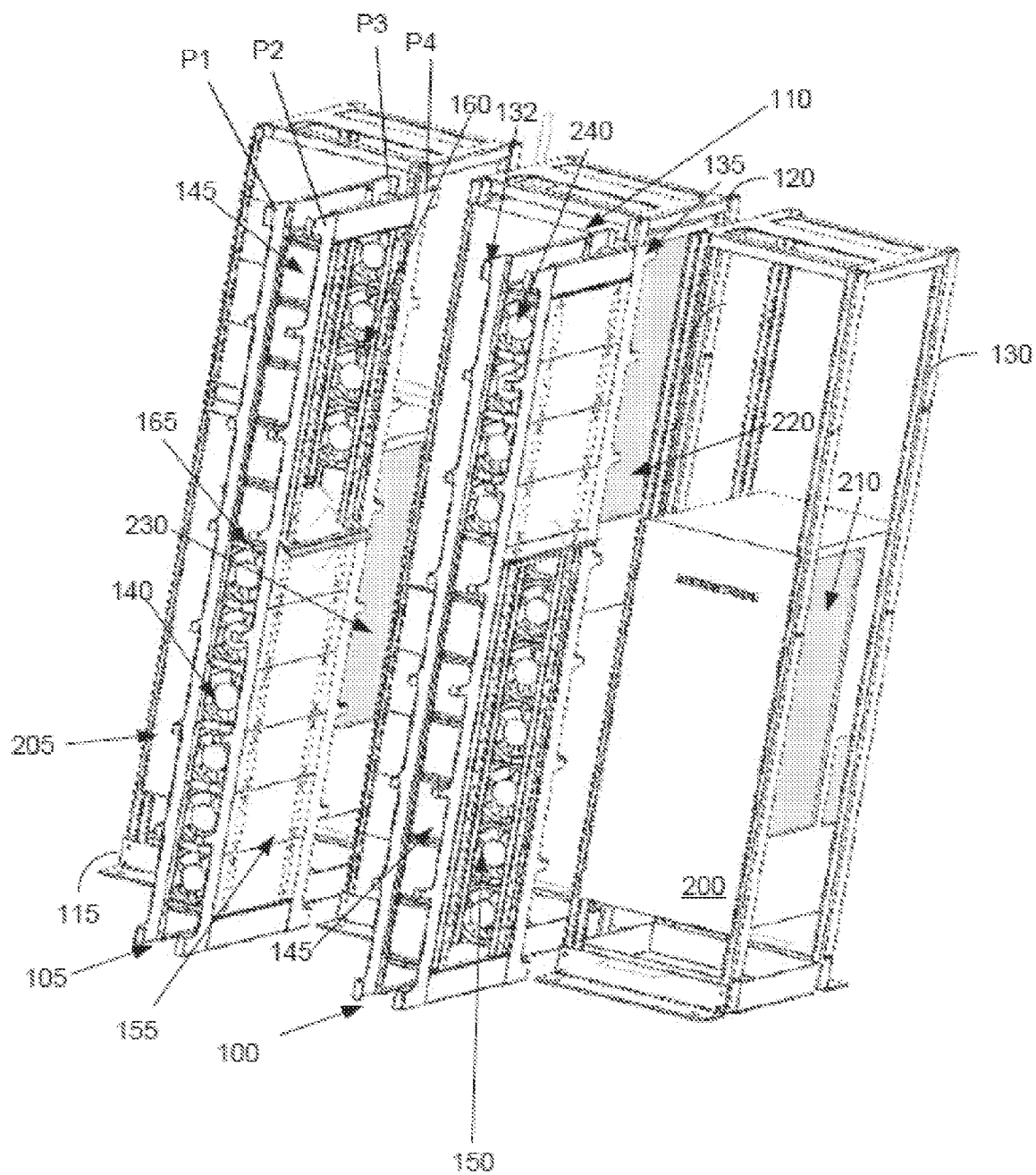
FIG. 2 is perspective view of the embodiment of the integrated ventilation system of FIG. 1 according to the present disclosure.

In FIG. 2, a diagram depicting a perspective view of the integrated ventilation system 100 is shown. The design of one embodiment of the integrated ventilation system 100 allows networking racks 120, 130 housing side-to-side cooling hardware or equipment 110, 200 to receive cold air from in front of the rack 120, 130 (e.g., a cold air aisle) to the appropriate intake or cooling vents of the hardware 110 and to direct or channel hot air being exhausted from the hardware 200 to the rear of the rack (e.g., a hot air aisle).

Referring back to FIG. 1, the integrated ventilation system 100 features a vertical cable management assembly or rack 132 integrated into the system 100 at opposite faces of the integrated ventilation system 100. The integrated ventilation system 100 is designed to be positioned next to one or more network racks 120, 130. In one implementation, the integrated ventilation system 100 is sandwiched between two network racks 120, 130. Further, in one possible implementation, the integrated ventilation system 100 is integrated with a first cable management assembly 132 at a front face of the rack 120 and a second cable management assembly 135 (FIG. 2) at a rear face of the rack 120. In one embodiment, rungs or brackets of the cable management assembly 132, 135 extend about, but not limited to, 3 inches from the face of the network rack next to it. The integrated ventilation system 100, in one embodiment, generally conforms to a footprint of a standard network rack except for the width of the integrated ventilation system being considerably smaller and for rungs/brackets of the cable manager assembly 132, 135 extending past the network rack rails. In one embodiment, a width of the integrated ventilation system is, but not limited to being, six inches. Accordingly, varying widths may be employed, such as 9 inches and 12 inches, to accommodate different preferences and/or requirements. Similarly, lengths of other dimensions (e.g., height and depth) of the integrated ventilation system 100 may also vary in different embodiments to accommodate particular preferences and/or requirements.

The integrated ventilation system 100, in one embodiment, includes a four post (P1, P2, P3, P4) frame structure, as shown in FIG. 2. The four post frame structure comprises horizontal mounting rails at a top and bottom portion of the frame structure to form a base and top having a rectangular cross section. Each vertical mounting rail, in one embodiment, includes a series of evenly-spaced, threaded mounting apertures or locations, extending along substantially its entire length, for use in mounting fan assemblies, panels, cable management assemblies, patch panels, or the like thereto. The rack rail holes on the integrated ventilation system, in one embodiment, are arranged in sets of three holes, spaced vertically ⅝ of an inch apart.

In many other network-type racks, cable management is provided at a front part of the rack. In contrast, the integrated ventilation system 100 contains cable management at both the front and rear of the system. For example, in some hardware devices, fiber optic or copper cable may be connected at the rear or the front of the device. Also, there are power cables that connect to the device at the rear. With a cable management rack or assembly 135 at the rear, the power and/or networking cables can be secured properly so they do not get pulled out.

Note, in a network room or data center environment, a patch panel device will be mounted with the electronic equipment 110, 200 within a network rack 120, 130. Generally, the patch panel device will sit on a top or bottom of a rack 120, 130 that has fiber or copper patch panels. From the patch panels, cables are generally plugged and then routed into the equipment. In one embodiment, a patch panel is further integrated with the integrated ventilation system 100. In this way, by moving the patch panel device from the network rack to the integrated ventilation system 100, more room is available within the network rack.

The integrated ventilation system 100 also includes one or more intake high speed fans 140 to facilitate and increase the flow of air from in front of the rack 120, 130 and the integrated ventilation system 100 to a side of the rack 120, 130 housing equipment or hardware 110 with intake ventilation. In one embodiment, fan assemblies 140 may be substantially flush with the network rails positioned to its side.

A user can configure the number of fans 140 to deploy and the placement of individual intake fans 140 within the integrated ventilation system 100. Therefore, the integrated ventilation system 100 is adjustable to accommodate for various vendor types of hardware configurations. As previously discussed, a vertical mounting rail, in one embodiment, includes a series of evenly-spaced, threaded mounting apertures or locations, extending along substantially its entire length, for use in mounting fan assemblies, panels, cable management assemblies, patch panels, or the like thereto.

One embodiment of the integrated ventilation system 100 also includes one or more outtake or exhaust high speed fans 150 (FIG. 2) to facilitate and increase airflow to be exhausted from computer hardware or electronic equipment mounted in the rack 120, 130 to an area behind the rack (e.g., the hot aisle). A user can configure the number of outtake fans 150 to deploy and the placement of individual fans 150 within the integrated ventilation system 100.

By integrating an integrated ventilation system 100 that will direct air (intake and exhaust) and a cable manager into one piece of hardware and including a dedicated cold air intake in addition to a dedicated hot air exhaust in a system with a small footprint, network room cooling is improved, along with efficient use of network room real estate. Further, the design is modular so that a standard networking rack (e.g., one conforms to Electronic Industries Alliance standards and specifications) for use can be attached to the integrated ventilation system and used in standard deployments.

If one was to eliminate the fans 140, 150, then the air becomes static and must be moved solely or predominantly by the intake and exhaust fans of the computer hardware or electronic equipment 110. By integrating individual fans for both intake and exhaust in the integrated ventilation system 100, the cubic feet per minute (CFM) of airflow is significantly increased through a piece of computer hardware 110.

Referring to FIG. 1 and FIG. 2, three network racks 115, 120, 130 are shown. Each network rack 115, 120, 130 contains a piece of computer hardware or electronic equipment 110, 200, 205. Two integrated ventilation systems 100, 105 are shown in between respective network racks 115, 120, 130. In the view of FIG. 2, the integrated ventilation systems 100, 105 are positioned in a cold air aisle so that components of the integrated ventilation system are visible. In use, the integrated ventilation systems will be slid in between or positioned adjacent to the network racks 115, 120, 130 and bolted to the adjacent racks, as reflected in FIG. 1. In one embodiment, the integrated ventilation system 100, 105 has two bolts on top and two bolts on bottom for securing the system to neighboring racks and/or floor.

In a network room, cooling comes from floor in front of the racks, such as through a raised floor (e.g., having perforated tiles) in front of the rack. Cool air is drawn through the hardware/equipment 110 and exhausted out to the next aisle behind it which is the hot aisle. In accordance with one embodiment, the integrated ventilation system 100, 105 intakes air from the front of the rack and exhausts air into the hot aisle.

Referring to FIG. 2, sections 210, 220, 230 represent cold intake sides of respective electronic machines or hardware 110, 200, 205 mounted in racks 115, 120, 130. Intake fans 140, 240 draw cold air in, directing the cold air through the intake sections/cool side of the individual hardware 110. On the face of the integrated ventilation system 100 opposite to a respective fan assembly 140, 150, one will notice that a section of the integrated ventilation system 100, 105 is capped off or enclosed with a blank or filler panel 145. Accordingly, on the backside, there are exhaust fans 150 drawing the air out into the hot aisle. To eliminate re-circulation of hot exhaust air internally within the integrated ventilation system 100, 105, removable filler panels (also called blanking panels) 145 maybe installed in empty rack space of the integrated ventilation assembly where fans are not installed. This type of baffle or duct controls the airflow and prevents hot air in the proximity of the integrated ventilation system 100, 105 from being drawn into the inlets of neighboring equipment.

For each integrated ventilation system 100, 105, there may be an open cavity 160 that acts as a dedicated channel or passageway allowing air to flow into the intake of the individual hardware and/or allowing air to escape the outtake of the individual hardware. Accordingly, one or more adjustable or removable filler panels (vertical face panels 145 and vertical side panels 155) may be fastened to locations on the frame of the integrated ventilation system 100, 105 to create a desired size of the cavity/passageway 160. For example, the size of the cavity/passageway 160 should generally correspond to the size of the inlet/exhaust vent of the electronic equipment or hardware 110 that is to be in fluid communication with the cavity/passageway 160. Through proper sizing and alignment of one or more filler panels, the cavity may be sized and aligned appropriately to fit the intake or exhaust vents, as the case may be, of a particular piece of equipment/hardware 110 to avoid air from one segregated aisle (e.g., hot or cold) escaping and mixing with air from the other segregated aisle (e.g., cold or hot).

Figure 3:
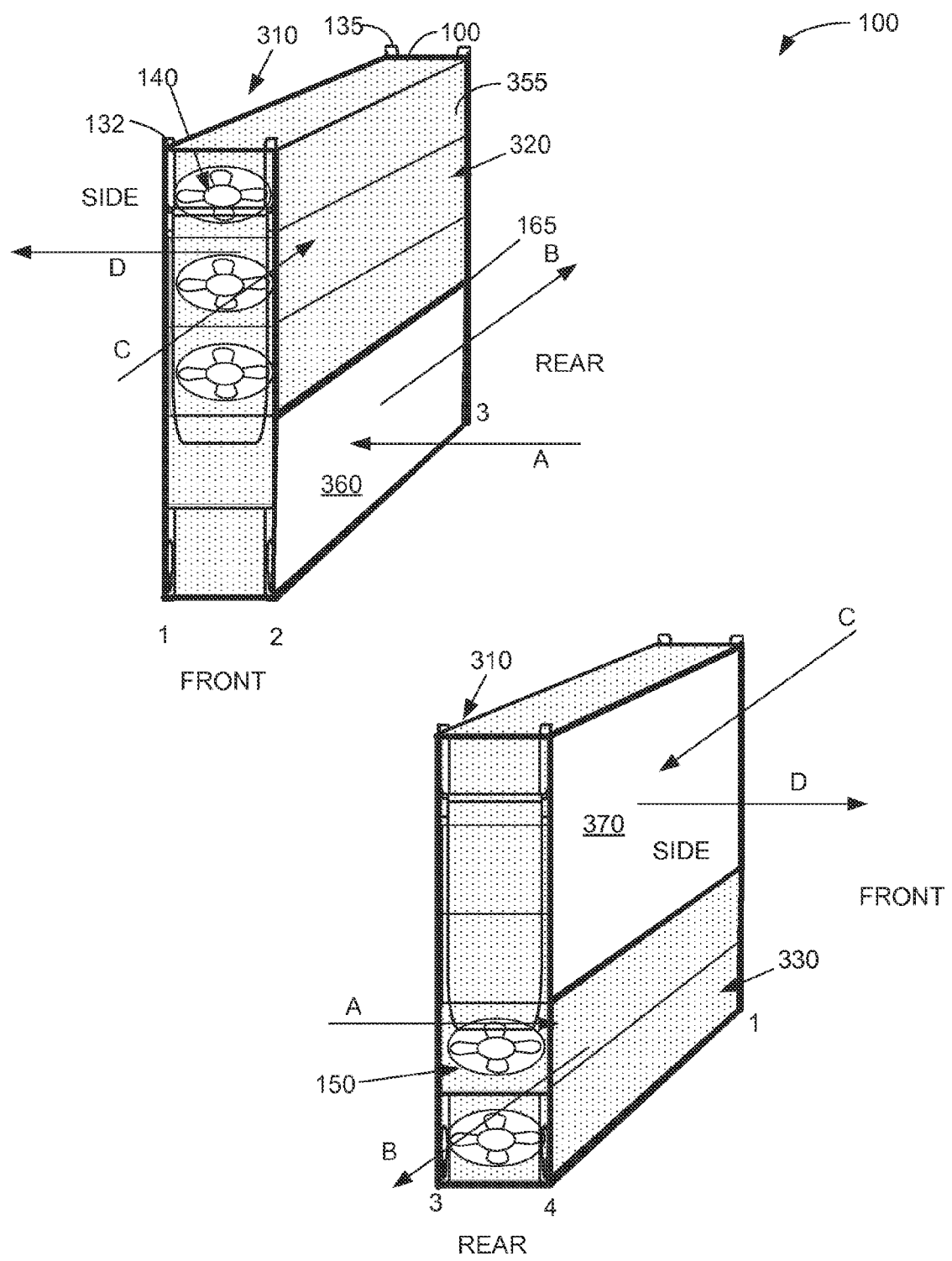
FIG. 3 is a diagram depicting a representation of one embodiment of the integrated ventilation system in accordance with the present disclosure.

With placement of the filler panels, the integrated ventilation system 100, 105 may comprise a frame structure 310 (FIG. 3) including includes two sidewalls 320, 330 (FIG. 3) formed of at least one removable vertical side panel 155, where one of the two sidewalls has a first opening or cavity 160 defined by at least one removable vertical side panel 155, 355 (FIG. 3). The first opening or cavity 360 (FIG. 3) is a channel or passageway for receiving exhaust from an exhaust vent of electronic equipment or computer hardware positioned next to the frame structure, where the exhaust vent is positioned next to the first opening 360. A second of the two sidewalls may also have a second opening or cavity 370 (FIG. 3) defined by at least one removable vertical side panel 155, 355 where the second opening is for transmitting intake air from at least one intake fan assembly 140 to an intake vent of electronic equipment positioned next to the frame structure. In particular, the intake vent is positioned next to the second opening 370.

The integrated ventilation system 100 is designed to help segregate the hot and cold air aisles in a network room from one another. In FIG. 2, at the bottom, intake fans 140 of system 100 direct air from a cold aisle in front of the racks 115, 120, 130 to the intake vents of machine or hardware 200. At the upper portion of the integrated ventilation system 100, outtake or exhaust fans 150 direct air from the exhaust or outtake vents of machine 110 to the hot aisle behind the racks. To keep the respective airflow separate, an adjustable or removable segregation plate 165 (FIG. 2 and FIG. 3), which may be horizontally flat or tilted at an angle relative to a base of the integrated ventilation system 100, is mounted to the support posts P1, P2, P3, P4 (FIG. 2) dividing these areas of the integrated ventilation system 100, as shown. Also, vertical blank or filler plates 145 are mounted opposite exhaust fans 150 to keep hot air from escaping to the cold aisle, and vertical blank or filler plates 145 are mounted opposite intake fans 140 to keep cold air from escaping to the hot aisle or mixing with hot air. The support posts P1, P2, P3, P4 (FIG. 2) comprising a frame of the integrated ventilation system 100 contains predrilled holes which are used to fasten respective plates to the support, as desired by a user. In one embodiment, sealing members, such as gaskets, rubber seals, or caulk, may be used to seal the plates to the support structure to prohibit air from escaping in or out of the integrated ventilation system 100.

Referring to FIG. 2, the cable management assembly 132 helps manage routing of cable to and from the neighboring equipment 110, 200. Behind the cable management assembly 132, fan sets 140 or blank plates 145 are mounted to the integrated ventilation system 100. Then behind the fan sets 140, the integrated ventilation system 100 may be configured with a cavity or compartment where air is being drawn into the cavity from the fan(s) 140. On the side near the cavity where the electronic equipment or computer hardware sits, the electronic equipment also has its own fan sets that draw air in or exhaust the air out. If one is not careful, when running and routing cables to various equipment, air flow may be obstructed to and from the electronic equipment. Accordingly, by integrating one or more cable management assemblies 132, 135 on the integrated ventilation system 100, management of the cables is improved to help facilitate airflow. For example, cables may be bundled together and secured to rungs on the vertical cable management assembly 132 to help create and maintain open spaces within the cavity or compartment. By having a cable management assembly 132, 135 on both faces of the integrated ventilation system 100, cables can be distributed between the front and back to help create more space for unobstructed air flow. Also, the various fans 140, 150 included as part of the integrated ventilation system facilitate air movement through the electronic equipment in neighboring rack(s). It is noted that various cable management assemblies may be used in different embodiments of the integrated ventilation system. In general, a cable management assembly provides rungs, rings, brackets, hooks, loops, clips, etc. which facilitate bundling and organized routing of network cables and cords.

As shown in FIG. 1, equipment 110 vertically overlaps with equipment 200 but that does not necessarily mean that the intake/exhaust vents of electronic equipment 110 vertically overlaps with the intake/exhaust vents of equipment 200, since intake/exhaust vents do not generally encompass a whole side of electronic equipment. The integrated ventilation system 100 can be arranged to accommodate any configuration of the equipment by moving the necessary fans and plates, as needed.

Referring now to FIG. 3, a diagram showing a representation of one embodiment of the integrated ventilation system 100 is shown. Please note that the foregoing and following drawings are not necessarily to exact scale. The top portion of the figure shows a perspective view with the front face of the integrated ventilation system 100 visible. In this view, an open compartment or cavity 160 (FIG. 2) has been arranged within the integrated ventilation system on a right side. Correspondingly, the bottom portion of the figure shows a perspective view with the rear face of the integrated ventilation system 100 visible. In this view, the cavity 370 and exhaust fans 150 are visible, where they were not visible in the top portion of the figure. Vertices 1, 2, 3, 4 have been marked in both portions of the representations to identify corresponding locations within the two views.

A flow of air (A), such as from an exhaust vent of neighboring electronic equipment, may be drawn to the cavity 360 and blown out of the rear of the integrated ventilation system 100 by one or more exhausts fans in fluid communication with the cavity 360, as demonstrated by the arrow marked B. Also, air may be drawn in to another cavity (visible in the bottom portion as 370) by one or more intake fans 140 (in fluid communication with the cavity), as demonstrated by arrow C, and directed to intake fans of neighboring equipment, as demonstrated by arrow D.

Figure 4:
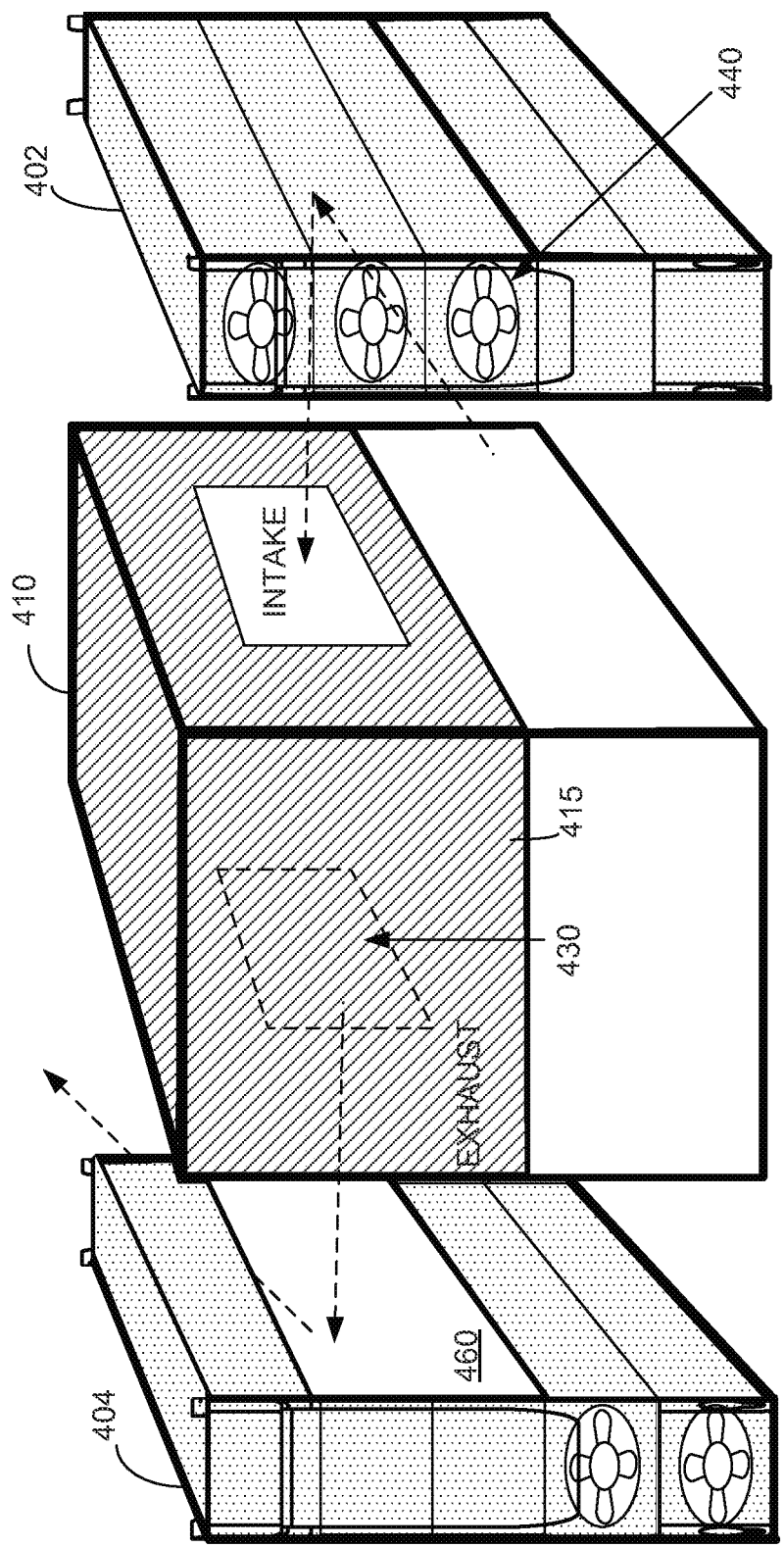
FIG. 4 is a diagram showing air-flow patterns of one implementation of the integrated ventilation system of FIG. 3 for a particular arrangement according to an embodiment of the present disclosure.
Figure 5:
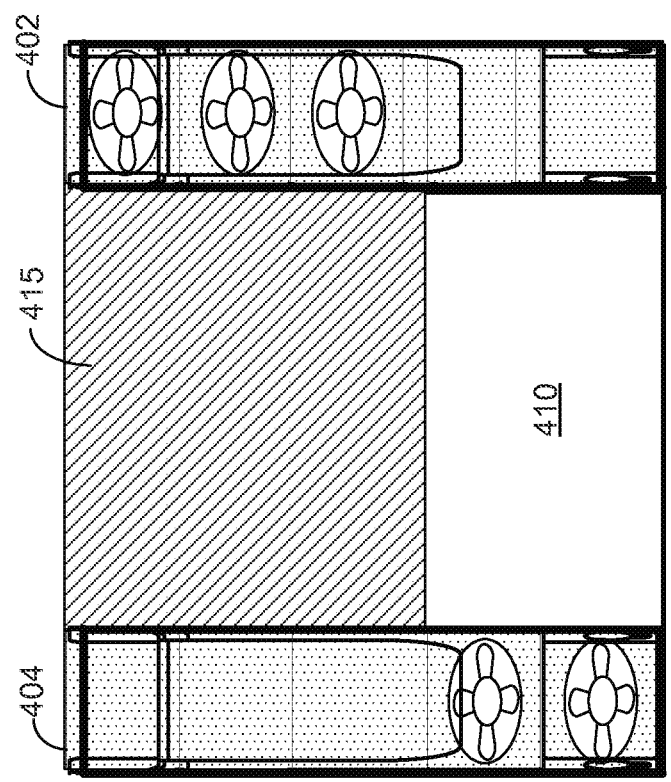
FIG. 5 is a diagram depicting the integrated ventilation system of FIG. 4 in close proximity to neighboring network racks according to an embodiment of the present disclosure.

Referring now to FIG. 4, a diagram showing airflow patterns of one implementation of the integrated ventilation system 100 (FIGS. 1-3) is depicted. Here, one integrated ventilation system 402 is positioned next to a rack 410 of electronic equipment 415. Please note, that in order to illustrate the workings of the integrated ventilation system, the integrated ventilation system 402, 404 is not shown in close position with the rack 410. In actual practice, however, the integrated ventilation system 100 is in close position with (and may be in direct contact with) the rack 410, as represented in FIG. 5.

The rack 410 houses a piece of electronic equipment 415 at a top portion of the rack 410. The electronic equipment utilizes side-to-side ventilation, so an intake vent 420 is shown on the right side of the equipment 415. The intake vent 420 is positioned next to an open cavity or compartment (not shown since hidden from view) of integrated ventilation system 402.

On the left side of the equipment 415, an exhaust or outtake vent 430 is represented although hidden from view. The exhaust vent 430 is positioned next to an open cavity or compartment 460 of integrated ventilation system 404. Accordingly, in practice, intake fans 440 of integrated ventilation system 402 draw ambient air into the open cavity next to the intake vent 420 of the equipment 415 which is directed to the intake vent 420, as represented by the dashed arrows. Then, air exhausted from the equipment 415 flows to the open cavity 460 of the integrated ventilation system 404 and expelled out of the system 404 via exhaust fans (which are not visible in this view), as represented by the dashed arrows.

Figure 6:
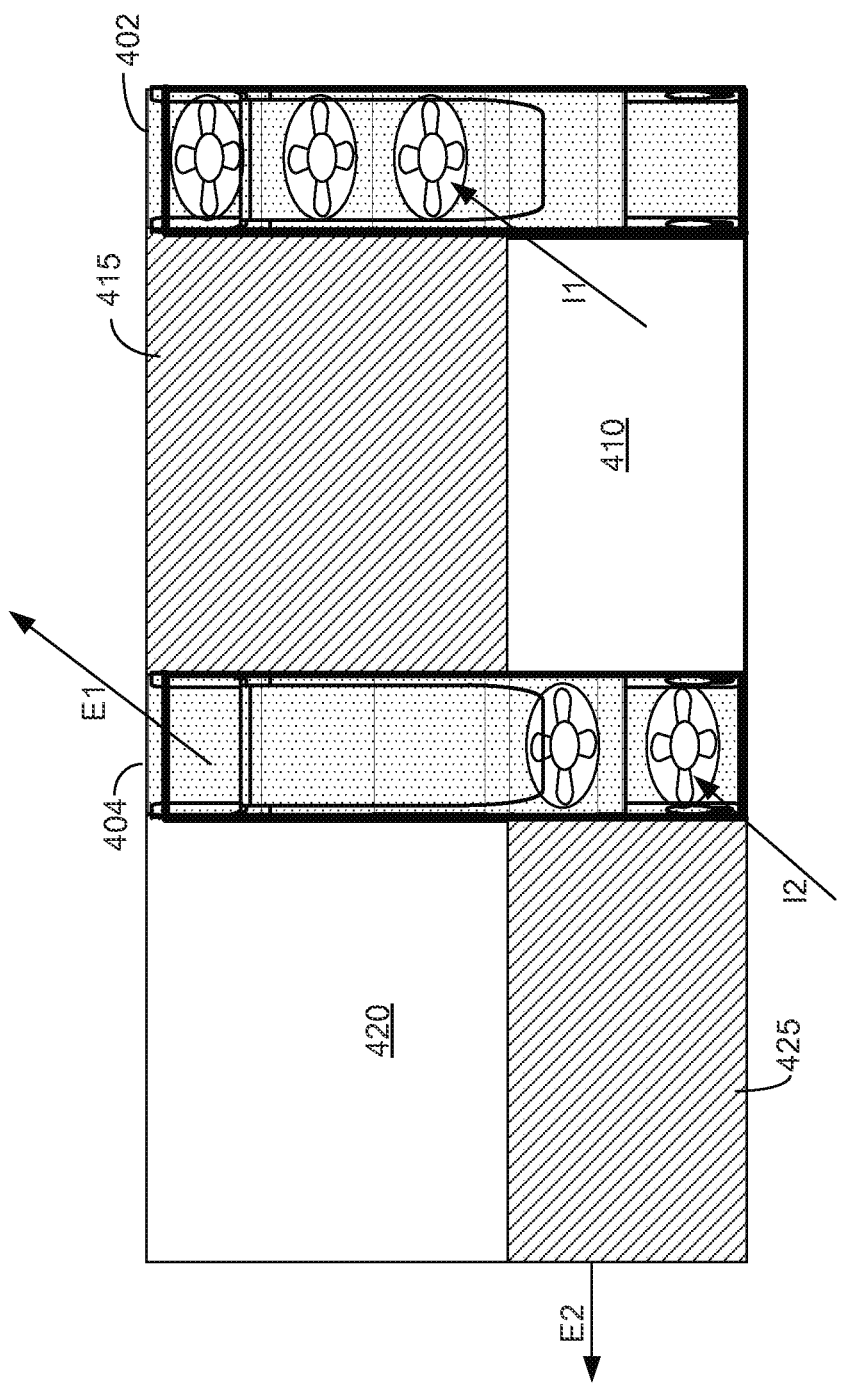
FIG. 6 is a diagram showing the arrangement of FIG. 4. with the addition of a network rack according to an embodiment of the present disclosure.

Referring now to FIG. 6, a diagram showing the arrangement of FIG. 4. is shown with the addition of another rack 420 next to integrated ventilation system 404. In rack 420, a piece of electronic or computer equipment is mounted at a bottom portion of the rack 420. It is noted that the exhaust or outtake vent of equipment 415 would not overlap with the intake vent of equipment 425 if they were positioned side by side. Accordingly, vertical placement of the exhaust vent of the electronic equipment 415 is offset from vertical placement of the intake vent of the electronic equipment 425. Arrow I1 represents ambient air being drawn in the open cavity of integrated ventilation system 402 and directed to the intake vent of equipment 415. Arrow E1 represents exhaust air received by the open cavity of integrated system 404 and exhausted out of the back of the system by one or more exhaust fans (which are not visible in this diagram representation). Further, Arrow I2 represents ambient air being drawn from in front of the integrated ventilation system 404 to the open cavity of integrated ventilation system 404 and directed to the intake vent of equipment 425. Arrow E2 represents air being exhausted out of a side of the equipment 425 (due to the non-existence of an integrated ventilation system in this particular arrangement which could move the exhaust air to a back of the respective racks). Therefore, due to the non-overlapping vertical placement of the intake and exhaust vents of respective pieces of equipment 415, 425 within respective network racks 410, 420, a single integrated ventilation system 404 can help facilitate intake airflow (I2) for one piece of equipment 425 and help facilitate exhaust airflow (E1) for another piece of equipment 415.

Figure 7:
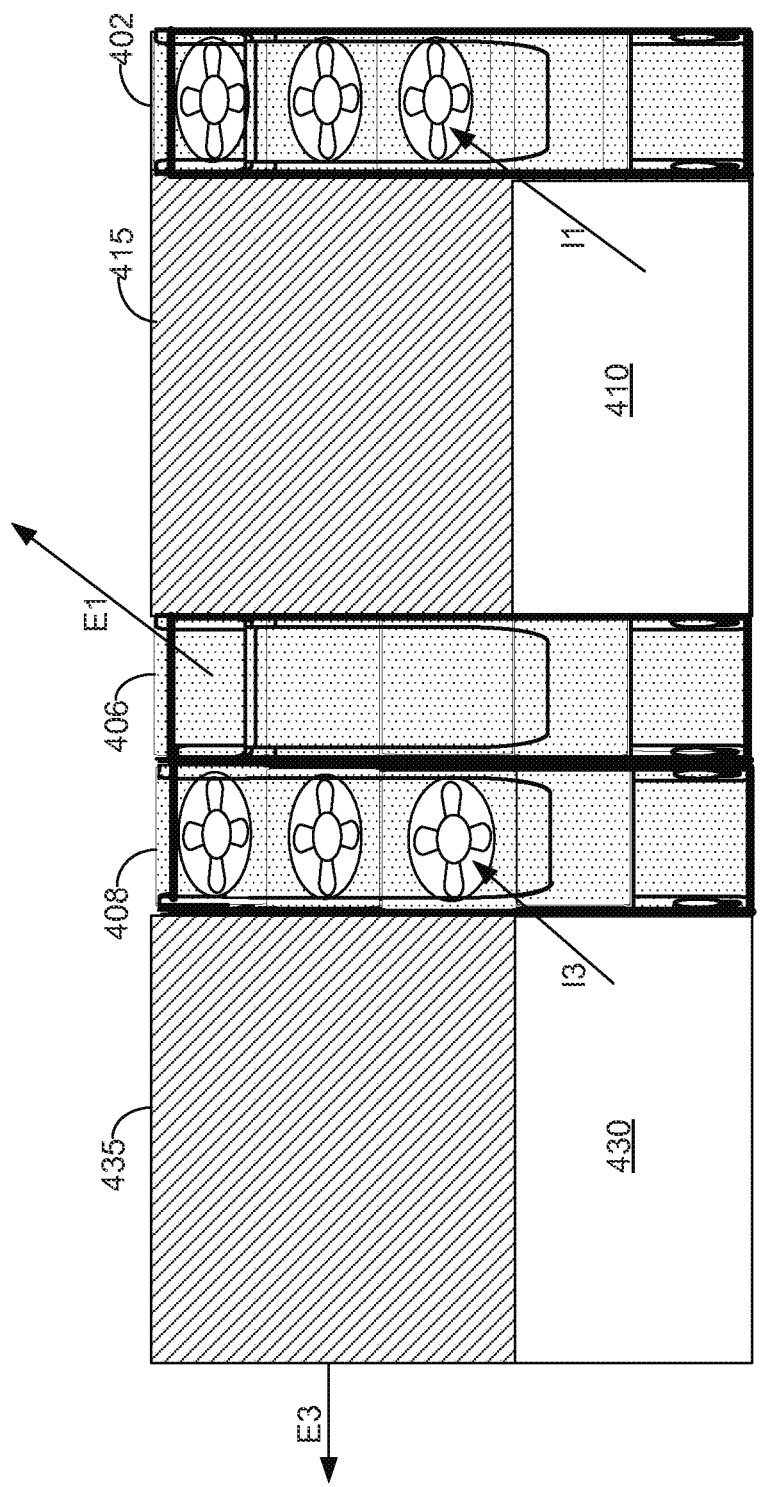
FIG. 7 is a diagram depicting an arrangement of network racks and embodiments of the integrated ventilation systems for overlapping electronic equipment vents according to the present disclosure.

In an arrangement having overlapping vertical placement of the intake and exhaust vents of respective pieces of equipment 415, 435 within respective network racks 410, 420, two integrated ventilation systems 406, 408 may be used, as shown in FIG. 7. Here, respective pieces of equipment 415, 435 are mounted at a top portion of respective racks 410, 430 and have intake and exhaust vents that would overlap with one another if placed side by side.

Arrow I1 represents ambient air being drawn in the open cavity of the integrated ventilation system 402 and directed to the intake vent of equipment 415. Correspondingly, Arrow E1 represents exhaust air received by the open cavity of integrated system 406 and exhausted out of the back of the system by one or more exhaust fans located at a top portion of the integrated ventilation system 406 (which are not visible in this diagram representation). Further, Arrow I3 represents ambient air being drawn from in front of the integrated ventilation system 408 to the open cavity of integrated ventilation system 408 and directed to the intake vent of equipment 435. Correspondingly, Arrow E3 represents air being exhausted out of a side of the equipment 435 (due to the non-existence of an integrated ventilation system in this particular arrangement which could move the exhaust air to a back of the respective racks). Therefore, due to the overlapping vertical placement of the intake and exhaust or outtake vents of respective pieces of equipment 415, 435 within respective network racks 410, 430, multiple integrated ventilation systems 406, 408 are used, since exhaust and intake fans will overlap and cannot be positioned within a single integrated ventilation system in such a manner. Note, without the multiple integrated ventilation system, the equipment 415, 435 having side-to-side cooling will draw air in and exhaust air out into adjacent equipment which is the intake side, and this equipment may then exhaust it out to the intake vent of another piece of equipment, all the while causing the temperature of the air to increase.

Figure 8:
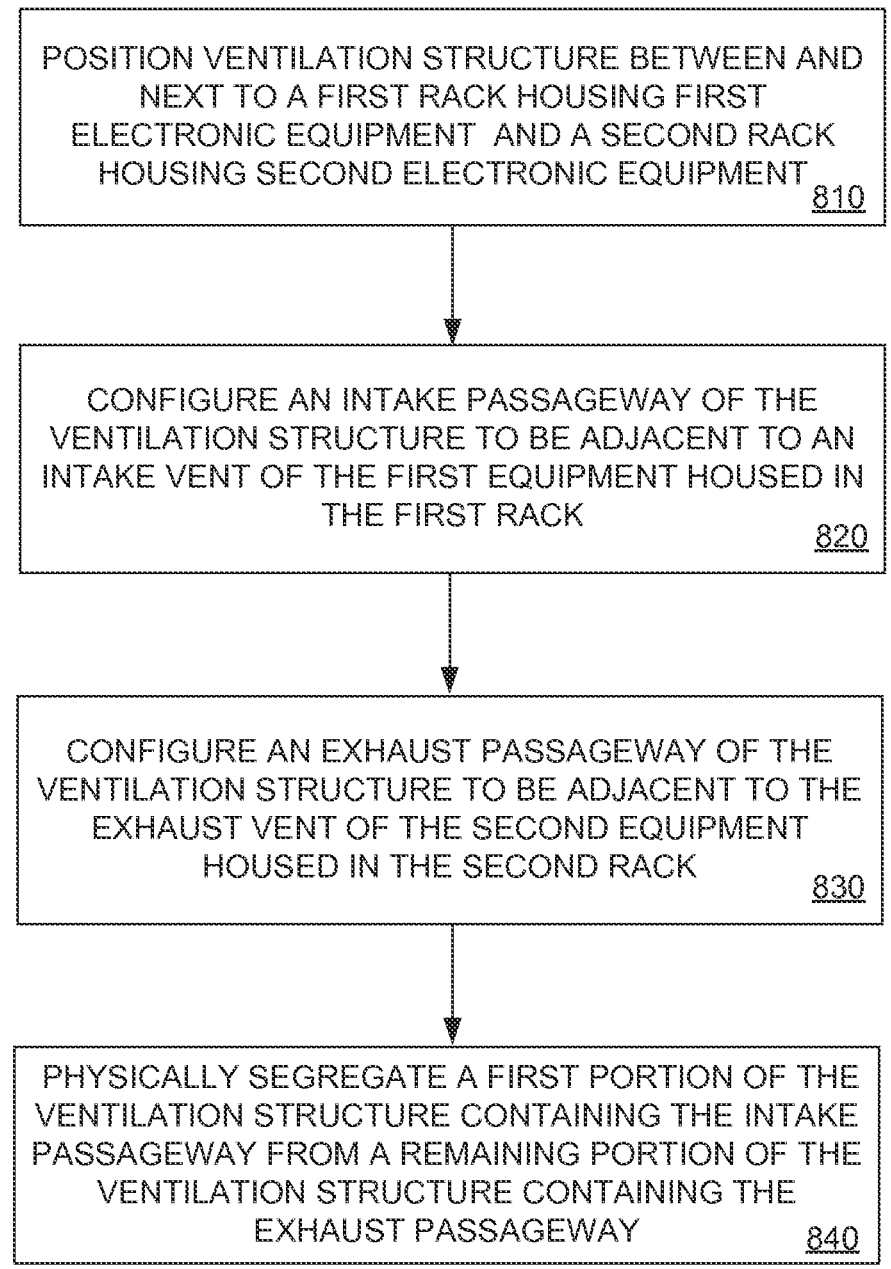
FIGS. 8-10 are flow chart diagrams describing embodiments of a method of providing ventilation to electronic equipment in accordance with the present disclosure.

Referring now to FIG. 8, a flow chart diagram describing one embodiment of a method of providing ventilation to electronic equipment is shown. The method includes positioning (810) a ventilation structure 100 (FIGS. 1-3) between and next to a first rack 120 (FIG. 1) housing first electronic equipment 110 (FIG. 1) and a second rack 130 (FIG. 1) housing second electronic equipment 200 (FIG. 1), where the ventilation structure 100 has a box-like structure with at least one air inlet fan assembly 140 (FIG. 1) arranged in front face of the ventilation structure 100 for transmitting intake air to an intake passageway 370 (FIG. 3) and at least one air exhaust fan assembly 150 (FIG. 2) arranged in a rear face of the ventilation structure 100 for receipt of exhaust air from an exhaust passageway 360 (FIG. 3). The method further includes configuring (820) the intake passageway 370 (FIG. 3) to be adjacent to an intake vent of the first electronic equipment 110 housed in the first rack 120 and configuring (830) the exhaust passageway 360 to be adjacent to the exhaust vent of the second equipment 200 housed in the second rack 130. One embodiment of the method further physically segregates (840) a first portion of the ventilation structure 100 from a remaining portion of the ventilation structure, where the first portion contains one of the first and second openings and the remaining portion containing a remaining one of the first and second openings.

Figure 9:
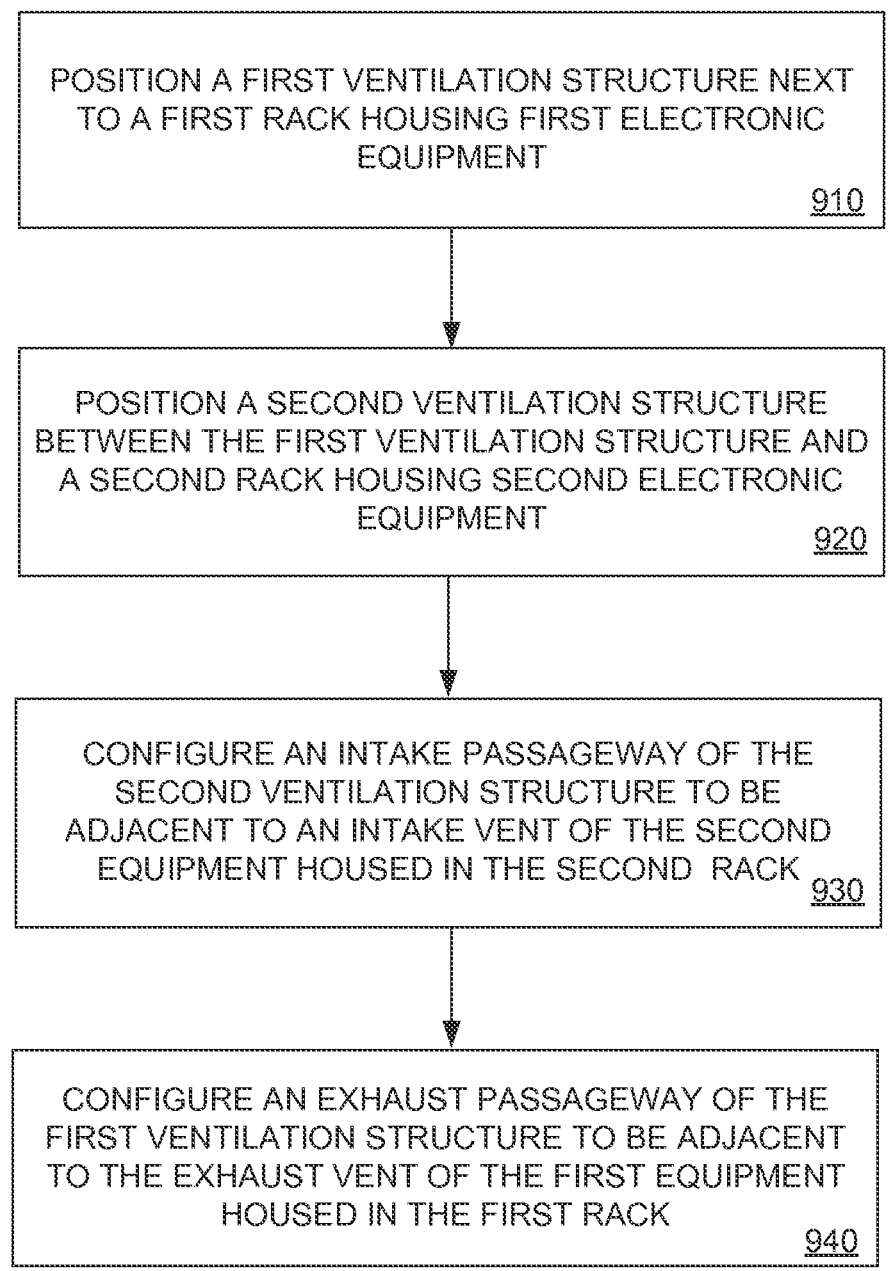

Next, FIG. 9 is a flow chart diagram describing one embodiment of a method of providing ventilation to electronic equipment including positioning (910) a first ventilation structure 402 (FIG. 4) next to a first network rack 410 (FIG. 4) housing first electronic equipment 415 (FIG. 4). The first ventilation structure 402 (FIG. 4) has a box-like structure with at least one air exhaust fan assembly 150 (FIG. 4) arranged in a rear face of the ventilation structure 402 for receipt of exhaust air from an exhaust passageway 460 (FIG. 4). The method further includes positioning (920) a second ventilation structure 404 between the first ventilation structure 402 and a second rack 430 (FIG. 4) housing second electronic equipment 435 (FIG. 4), where the second ventilation structure 404 has a box-like structure with at least one air inlet fan assembly 140 (FIG. 4) arranged in front face of the second ventilation structure 100 for transmitting intake air to an intake passageway 370 (FIG. 3). The intake passageway is configured (930) to be adjacent to an intake vent of the second equipment 435 housed in the second rack 430, and the exhaust passageway is configured (940) to be adjacent to the exhaust vent of the first equipment 415 housed in the first rack 410.

Figure 10:
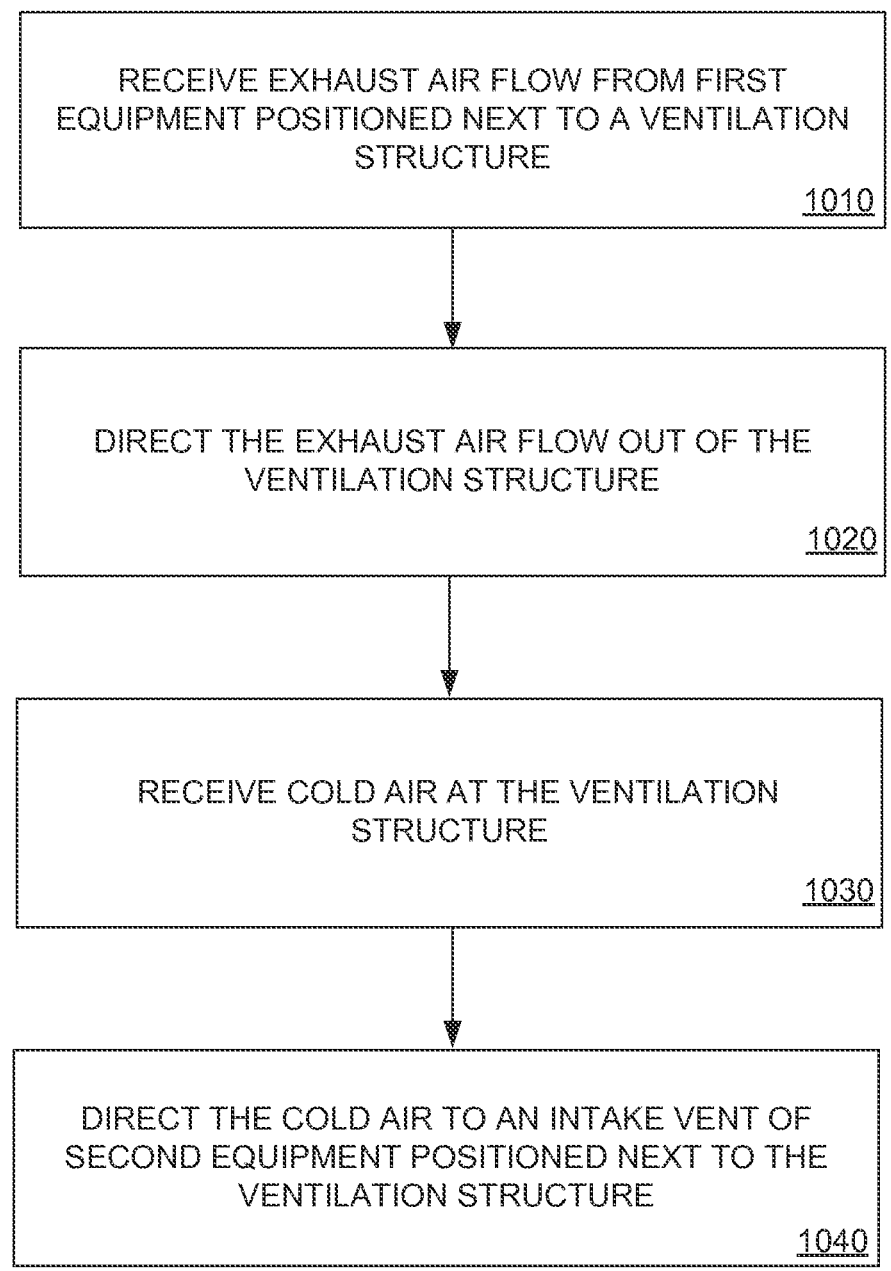

Next, in FIG. 10, one embodiment of a method of providing ventilation to electronic equipment is depicted within a flow chart diagram. The flow chart diagram recites receiving (1010) exhaust air flow from first equipment 200 (FIG. 1) positioned next to a ventilation structure 100 (FIG. 1) and directing (1020) the exhaust air to flow out of the ventilation structure 100 (e.g., via use of exhaust fan assembly 150). The cold air is received (1030) at the ventilation structure 100 (e.g., from an intake fan assembly 140) and directed (1040) to an intake vent of second equipment 110 (FIG. 1) positioned next to the ventilation structure 100.

Various advantages of the present disclosure may be appreciated by comparison of the present disclosure with conventional solutions to handling the problem of ventilation in a network room or data center. Prior to the development of the integrated ventilation system, one conventional design includes a chimney to direct the hot air return up into the hot air return plenum and the cold air to be pulled from the cold aisle. This design is built for hardware that is setup for front-to-back cooling. This design only works with facilities that have been designed around using a hot air return plenum and hardware that does not use side-to-side cooling ventilation. A second conventional design was built specifically for the Cisco Nexus chassis which employs side-to-side cooling. This has two main flaws, one being that it is 40 inches in width and therefore takes up a lot of valuable real estate which could be utilized better when building in high density designs. The second flaw is that this design really only has one baffle system that directs the exhaust out the rear into the hot aisle. Therefore, the cold air intake has no baffle and is essentially drawing air in from both the hot and cold aisles which frustrates the purpose of a baffle system.

A third design employs a baffle system using a chimney to direct the hot air return up into the hot air return plenum and the cold air to be pulled from directly under the rack into systems/hardware. This design only works with facilities that have been designed around using a hot air return plenum and does not appear to provide proper cubic feet per minute air flow into any large side-to-side cooling system/hardware.

With the present disclosure, an embodiment of an integrated ventilation system 100 having a small footprint draws in cold air and pushes out hot air, while providing cable management 130, 132 that helps further facilitate airflow. In one embodiment, the integrated ventilation system 100 contains a dedicated intake channel 370 for drawing cold air from a cold aisle and a dedicated exhaust channel 360 for pushing hot air into a hot aisle. Further, by extending the channels outside of a network rack 120, 130, the entire space of the network rack 120, 130 can be fully utilized to house additional electronic equipment. The disclosed integrated ventilation system 100 will work and is adaptable with a multitude of vendor's hardware having side-to-side cooling/ventilation.

It should be emphasized that the above-described embodiments of the present disclosure are merely possible examples of implementations, merely set forth for a clear understanding of the principles of the present disclosure. Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure.

One should also note that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Accordingly, it is intended that the scope of patent protection afforded the present disclosure is to be defined by the appended claims rather than the description set forth herein. Many variations and modifications may be made to the above-described embodiment(s) without departing substantially from the spirit and principles of the present disclosure. All such modifications and variations are intended to be included herein within the scope of this disclosure and protected by the following claims.

Therefore, having thus described various embodiments, at least the following is claimed:

1. An integrated ventilation system for electronic equipment comprising:
    a frame structure defined by four vertical posts having a rectangular cross-section;
    at least one air inlet fan assembly arranged in a front face of the frame structure for transmitting intake air to an intake passageway, the intake passageway for directing the intake air to intake vents of the electronic equipment positioned adjacent to the frame structure;
    at least one air exhaust fan assembly arranged in a rear face of the frame structure for receipt of exhaust air from an exhaust passageway, wherein the exhaust passageway is for directing the exhaust air from exhaust vents of the electronic equipment positioned adjacent to the frame structure to the at least one air exhaust fan assembly;
    at least one removable vertical face panel for mounting to a face of the frame structure to prohibit air from flowing in or out of a portion of the face being covered by the vertical face panel;
    at least one removable vertical side panel for mounting to a side of the frame structure to prohibit air from traveling in or out of a portion of the side being covered by the vertical side panel, the side of the frame structure being adjacent to the face of the frame structure; and
    at least one removable horizontal segregating panel for prohibiting air to travel between a top area above the removable horizontal segregating panel and a bottom area below the removable horizontal segregating panel.

2. The integrated ventilation system of claim 1, further comprising a first cable manager assembly integrated into the integrated ventilation system, wherein the first cable manager assembly extends from the front face of the frame structure.

3. The integrated ventilation system of claim 2, further comprising a second cable manager assembly integrated into the integrated ventilation system, wherein the second cable manager assembly extends from the rear face of the frame structure.

4. An integrated ventilation system for electronic equipment comprising:
    a frame structure defined by four vertical posts having a rectangular cross-section;
    at least one air inlet fan assembly arranged in a front face of the frame structure for transmitting intake air to an intake passageway, the intake passageway for directing the intake air to intake vents of at least one first unit of the electronic equipment positioned adjacent to the frame structure; and
    at least one air exhaust fan assembly arranged in a rear face of the frame structure for receipt of exhaust air from an exhaust passageway, the exhaust passageway for directing the exhaust air from exhaust vents of at least one second unit of the electronic equipment positioned adjacent to the frame structure to the at least one air exhaust fan assembly.

5. The integrated ventilation system of claim 4, further comprising a first cable manager assembly integrated into the integrated ventilation system, wherein the first cable manager assembly attaches to the front face of the frame structure.

6. The integrated ventilation system of claim 5, further comprising a second cable manager assembly integrated into the integrated ventilation system, wherein the second cable manager assembly extends from the rear face of the frame structure.

7. The integrated ventilation system of claim 4, further comprising at least one removable vertical side panel for mounting to a side of the frame structure to prohibit air from traveling in or out of a portion of the side being covered by the vertical side panel, the side of the frame structure being adjacent to the front face of the frame structure.

8. The integrated ventilation system of claim 7, wherein the frame structure includes:
    two sidewalls formed of the at least one removable vertical side panel;
    one of the two sidewalls having a first cavity passageway defined by the at least one removable vertical side panel;
    the first cavity passageway for receiving the exhaust air from the exhaust vents of the at least one second unit of the electronic equipment being positioned next to the frame structure;

the exhaust vents being positioned next to the first cavity passageway;

a second of the two sidewalls having a second cavity passageway defined by the at least one removable vertical side panel;

the second cavity passageway for transmitting the intake air from the air inlet fan assembly to the intake vents of the at least one first unit of the electronic equipment being positioned next to the frame structure; and the intake vents being positioned next to the second cavity passageway.

9. The integrated ventilation system of claim 4, further comprising at least one removable horizontal segregating panel for prohibiting air to travel between a top area above the removable horizontal segregating panel and a bottom area below the removable horizontal segregating panel.

10. The integrated ventilation system of claim 4, further comprising at least one removable vertical face panel for mounting to a face of the frame structure to prohibit air from flowing in or out of a portion of the face being covered by the removable vertical face panel.

11. The integrated ventilation system of claim 4, wherein the intake passageway is framed by at least one removable segregating horizontal panel mounted to the frame structure, at least one removable side vertical panel mounted to the frame structure, and at least one removable vertical face panel mounted to the front face of the frame structure.

12. The integrated ventilation system of claim 11, wherein the at least one removable segregating horizontal panel, the at least one removable vertical face panel, and the at least one removable side vertical panel are attachable to the posts of the frame structure in a plurality of mounting locations.

13. The integrated ventilation system of claim 4, wherein the exhaust passageway is framed by at least one removable horizontal panel mounted to the frame structure, at least one removable side vertical panel mounted to the frame structure, and at least one removable vertical face panel at the rear face of the frame structure.

14. The integrated ventilation system of claim 4, wherein the frame structure includes two sidewalls formed of at least one removable vertical side panel, one of the two sidewalls having a cavity passageway defined by the at least one removable vertical side panel, the cavity passageway for receiving exhaust air from the exhaust vents of the at least one second unit of the electronic equipment positioned next to the frame structure, the exhaust vents being positioned next to the cavity passageway.

15. The integrated ventilation system of claim 4, wherein the frame structure includes two sidewalls formed of at least one removable vertical side panel, one of the two sidewalls having a cavity passageway defined by the at least one removable vertical side panel, the cavity passageway for transmitting the intake air from the at least one air inlet fan assembly to the intake vents of the at least one first unit of the electronic equipment positioned next to the frame structure, the intake vents being positioned next to the cavity passageway.

16. A method of providing ventilation to electronic equipment comprising:

receiving, by a ventilation structure, exhaust air flow from exhaust vents of at least one first unit of the electronic equipment positioned next to the ventilation structure, wherein the ventilation structure is defined by four vertical posts;

directing the exhaust air flow out of an exhaust fan assembly arranged in a rear face of the ventilation structure;

receiving cold air from an inlet fan assembly arranged in a front face of the ventilation structure; and directing the cold air to intake vents of at least one second unit of the electronic equipment positioned next to the ventilation structure.

17. The method of claim 16, wherein the at least one first unit of the electronic equipment and the at least one second unit of the electronic equipment utilize side-to-side airflow cooling.

18. The method of claim 17, wherein the exhaust air flow is directed to a rear of the ventilation structure and the cold air is received from a front of the ventilation structure.

19. The method of claim 16, further comprising:

positioning the ventilation structure between and next to a first rack housing the at least one first unit of the electronic equipment and a second rack housing the at least one second unit of the electronic equipment, wherein the ventilation structure having a box-like structure with the inlet fan assembly arranged in the front face of the ventilation structure transmits intake air to an intake cavity passageway, wherein the exhaust fan assembly arranged in the rear face of the ventilation structure receives exhaust air from an exhaust cavity passageway;

configuring the intake cavity passageway to be adjacent to intake vents of the at least one first unit of the electronic equipment housed in the first rack; and configuring the exhaust cavity passageway to be adjacent to exhaust vents of the at least one second unit of the electronic equipment housed in the second rack, wherein vertical placement of the intake vents of the at least one first unit of the electronic equipment is offset from vertical placement of the exhaust vents of the at least one second unit of the electronic equipment.

20. The method of claim 19, further comprising physically segregating a top portion of the ventilation structure from a bottom portion of the ventilation structure, the top portion containing one of the intake and exhaust cavity passageways and the bottom portion containing a remaining one of the intake and exhaust cavity passageways.

* * * * *